United States Patent
Ishizaka et al.

(10) Patent No.: US 9,576,850 B2
(45) Date of Patent: Feb. 21, 2017

(54) METHOD FOR MANUFACTURING SEMICONDUCTOR DEVICE

(71) Applicant: TOKYO ELECTRON LIMITED, Tokyo (JP)

(72) Inventors: Tadahiro Ishizaka, Yamanashi (JP); Atsushi Gomi, Yamanashi (JP); Kenji Suzuki, Yamanashi (JP); Tatsuo Hatano, Yamanashi (JP); Yasushi Mizusawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/374,879

(22) PCT Filed: Jan. 24, 2013

(86) PCT No.: PCT/JP2013/000348
§ 371 (c)(1),
(2) Date: Jul. 25, 2014

(87) PCT Pub. No.: WO2013/111592
PCT Pub. Date: Aug. 1, 2013

(65) Prior Publication Data
US 2014/0377947 A1 Dec. 25, 2014

(30) Foreign Application Priority Data
Jan. 25, 2012 (JP) .................................. 2012-013362
Aug. 3, 2012 (JP) .................................. 2012-173294

(51) Int. Cl.
*H01L 21/768* (2006.01)
*C23C 16/16* (2006.01)
(Continued)

(52) U.S. Cl.
CPC .... *H01L 21/76879* (2013.01); *C23C 16/0272* (2013.01); *C23C 16/16* (2013.01);
(Continued)

(58) Field of Classification Search
CPC ......... H01L 21/02126; H01L 21/02145; H01L 21/28556; H01L 21/76814;
(Continued)

(56) References Cited

U.S. PATENT DOCUMENTS

2005/0272247 A1 12/2005 Ikeda et al.
2007/0082130 A1 4/2007 Shinriki et al.
(Continued)

FOREIGN PATENT DOCUMENTS

| JP | 2005-347472 | 12/2005 |
|----|-------------|---------|
| JP | 2006-114719 | 4/2006 |
| JP | 2009-081432 | 4/2009 |

OTHER PUBLICATIONS

Abstract for JP 2005-347472; http://www19.ipdl.inpit.go.jp; Dec. 15, 2005.
(Continued)

*Primary Examiner* — Thanhha Pham

(57) ABSTRACT

When a recess is formed in a SiCOH film, C is removed from the film to form a damage layer. If the damage layer is removed by hydrofluoric acid or the like, the surface becomes hydrophobic. By supplying a boron compound gas, a silicon compound gas or a gas containing trimethyl aluminum to the SiCOH film, B, Si or Al is adsorbed on the SiCOH film. These atoms bond with Ru and a Ru film is easily formed on the SiCOH film. The Ru film is formed using, for example, $Ru_3(CO)_{12}$ gas and CO gas. Copper is filled in the recess and an upper side wiring structure is formed by carrying out CMP processing.

7 Claims, 18 Drawing Sheets

(51) Int. Cl.
- *H01L 23/532* (2006.01)
- *C23C 16/02* (2006.01)
- *H01L 21/3105* (2006.01)
- *H01L 21/285* (2006.01)
- *H01L 21/02* (2006.01)

(52) U.S. Cl.
CPC .... *H01L 21/28556* (2013.01); *H01L 21/3105* (2013.01); *H01L 21/31058* (2013.01); *H01L 21/76814* (2013.01); *H01L 21/76826* (2013.01); *H01L 21/76843* (2013.01); *H01L 23/5329* (2013.01); *H01L 23/53238* (2013.01); *H01L 23/53295* (2013.01); *H01L 21/02126* (2013.01); *H01L 21/02274* (2013.01); *H01L 2924/0002* (2013.01)

(58) Field of Classification Search
CPC ......... H01L 21/76826; H01L 21/76841; H01L 21/76843; H01L 21/76879; H01L 23/53238
USPC .................................................. 438/637, 687
See application file for complete search history.

(56) References Cited

U.S. PATENT DOCUMENTS

| | | |
|---|---|---|
| 2007/0082132 A1 | 4/2007 | Shinriki et al. |
| 2008/0237860 A1 | 10/2008 | Ishizaka et al. |
| 2010/0285667 A1* | 11/2010 | Bonilla et al. ................ 438/702 |
| 2010/0317189 A1 | 12/2010 | Zama et al. |

OTHER PUBLICATIONS

Abstract for JP 2006-114719; http://www19.ipdl.inpit.go.jp; Apr. 27, 2006.
Abstract for JP 2009-081432; http://www19.ipdl.inpit.go.jp; Apr. 16, 2009.
International Search Report; International Patent Appl. No. PCT/JP2013/000348; Jan. 24, 2013.
Shin, Jinhong et al. "Effects of P on Amorphous Chemical Vapor Deposition RU-P Alloy Films for Cu Interconnect Liner Applications." J. Vac. Sci. Technol. A 26(4) (Jul./Aug. 2008): 974-79.

* cited by examiner

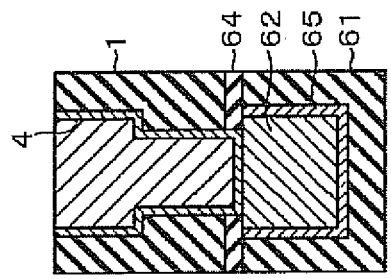
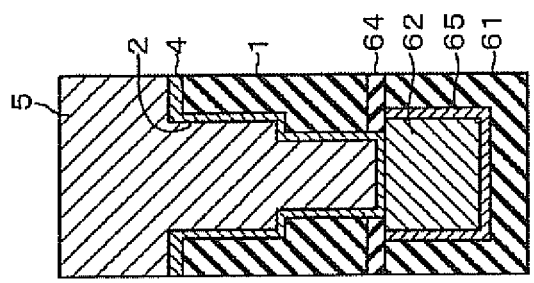
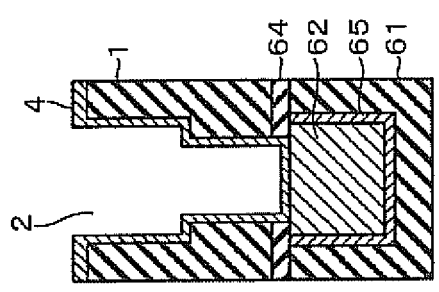
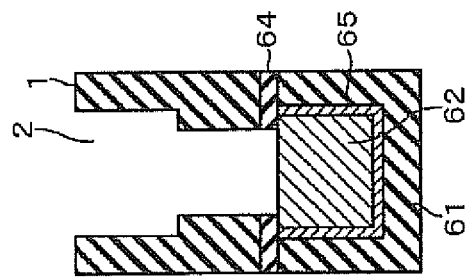

SiCOH FILM

SiCOH FILM

SiCOH FILM

SiCOH FILM

FIG. 14
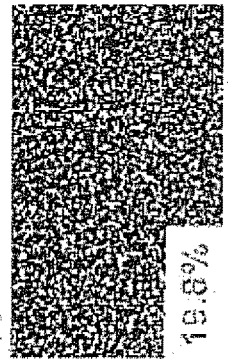
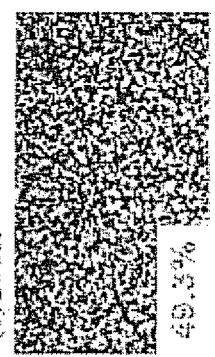

FIG. 16
COMPARATIVE EXAMPLE 2
(a) 10 sec
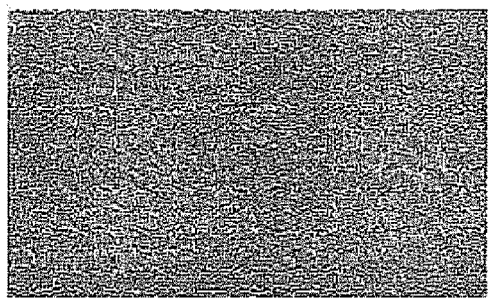
(b) 30 sec
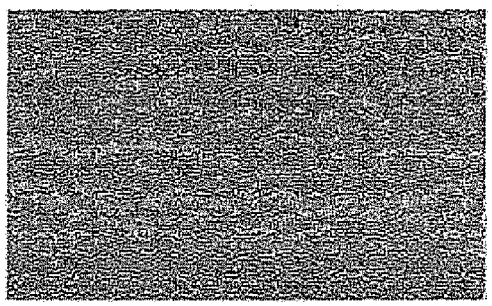
(c) 60 sec
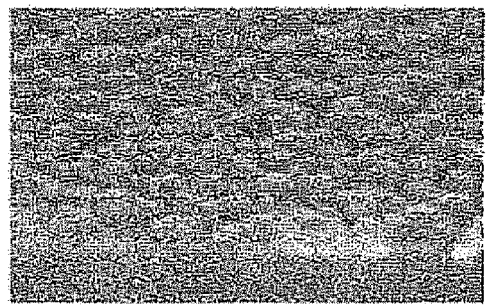
EXAMPLE 3
(a) 10 sec
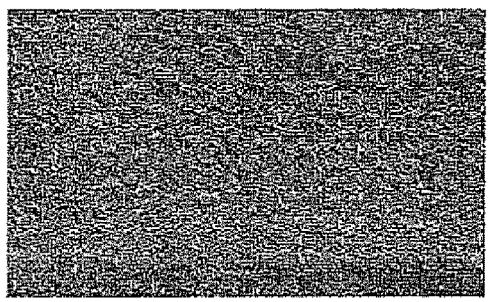
(b) 30 sec
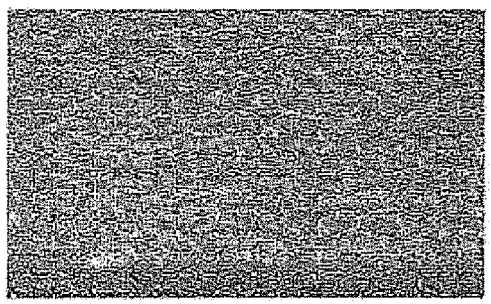
(c) 60 sec
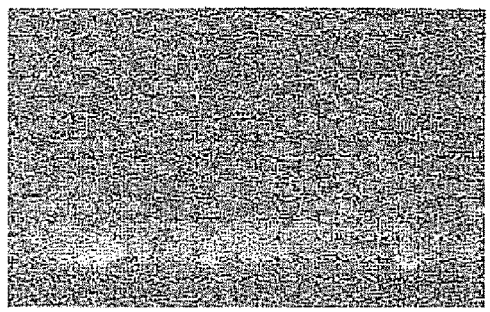

FIG. 17
COMPARATIVE EXAMPLE 2
(a) 10 sec.            3.2%
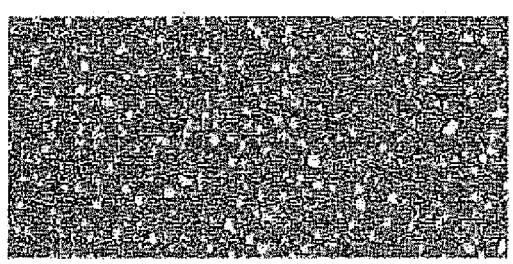
(b) 30 sec.            29.7%
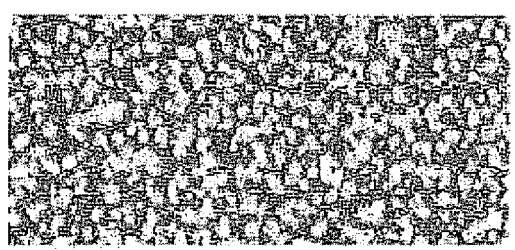
(c) 60 sec.            81.9%
EXAMPLE 3
(a) 10 sec            11.5%
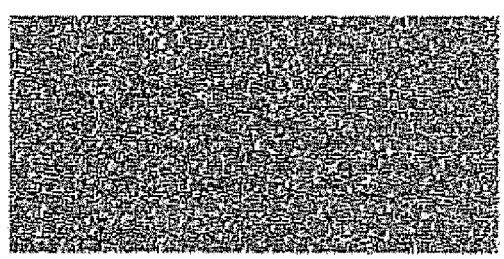
(b) 30 sec            38.7%
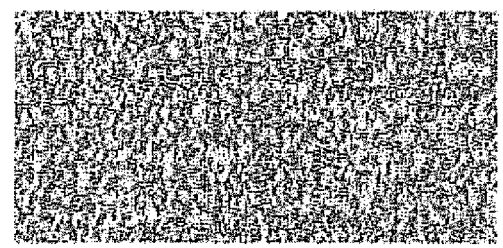
(c) 60 sec            92.1%
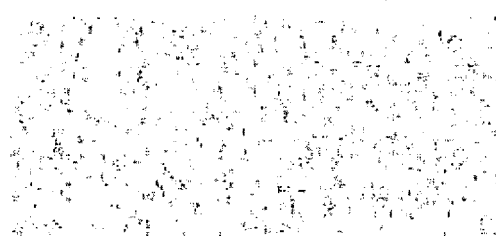

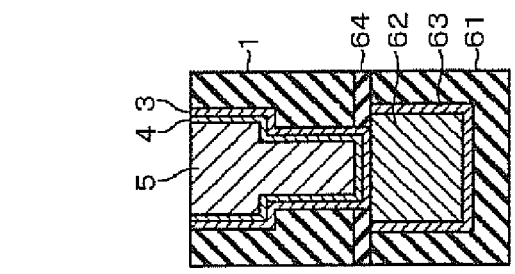
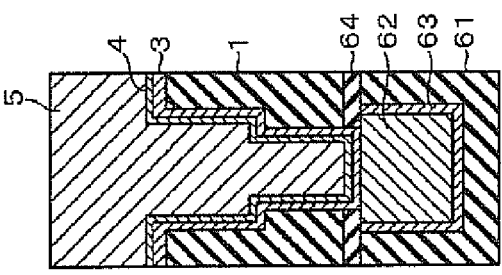
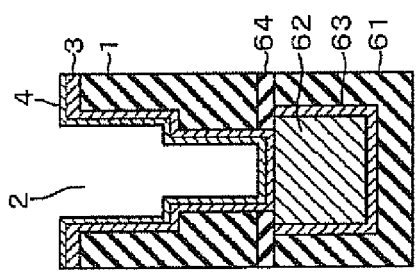
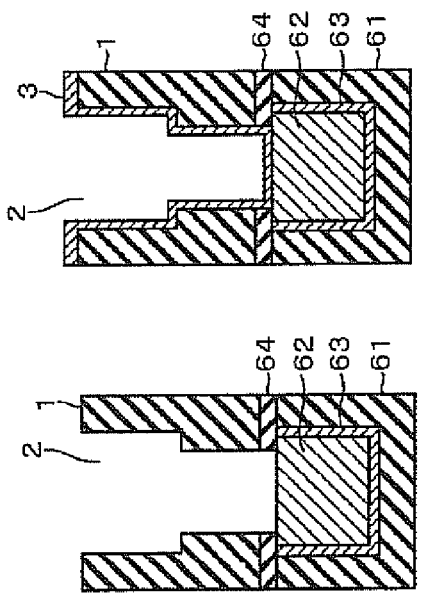
FIG.22A (PRIOR ART) FIG.22B (PRIOR ART) FIG.22C (PRIOR ART) FIG.22D (PRIOR ART) FIG.22E (PRIOR ART)

METHOD FOR MANUFACTURING SEMICONDUCTOR DEVICE

FIELD OF THE INVENTION

The present invention relates to, in a method of manufacturing a semiconductor device, a technique for forming a wiring by filling copper in a recess formed in an insulating film that is a low dielectric constant film.

BACKGROUND OF THE INVENTION

In a process of forming a multilayer wiring structure of a semiconductor device, the following process is performed. For example, a SiCOH film that is a low dielectric constant film made of silicon (Si), carbon (C), hydrogen (H) and oxygen (O) is formed as an interlayer insulating film on a substrate, and a recess including a trench and a via hole is formed in the interlayer insulating film. Then, copper (Cu) is filled in the recess to form an upper layer side wiring connected to a lower layer side wiring. Further, in order to prevent copper from diffusing into the interlayer insulating film, for example, tantalum (Ta), tantalum nitride (TaN) or a laminated film thereof is used as a so-called barrier film between the copper wiring and the interlayer insulating film. In addition, titanium (Ti), titanium nitride (TiN) or a laminated film thereof is known as a barrier film.

When miniaturization of the line width of a copper wiring is advanced along with miniaturization of a pattern of a semiconductor device, an increase in wiring resistance or electrode resistance (via resistance) in a via hole affects the performance of the semiconductor device. In order to reduce the resistance of conductive paths (wiring and electrode), it is important to increase the volume of copper, to reduce the thickness of an adhesion layer or a barrier layer of the bottom of the via hole, and to suppress the via resistance by reducing the number of interfaces.

However, in the case of using the above-mentioned materials as a barrier film, when the line width of the recess is fine and an aspect ratio of the recess increases, the filling characteristics become poor. Also, it is disadvantageous that the resistance of the material itself is large.

From this point of view, the use of Ru with a small resistance and good filling characteristics, instead of the above-mentioned materials, as a barrier film has been proposed in U.S. Application Publication No. US2008/237860A1 (FIG. 1). FIGS. 22A to 22E are diagrams showing a process of forming the copper wiring in the case of using Ru as a barrier film. First, after a recess 2 including a trench and a via hole is formed in an interlayer insulating film (SiCOH film) 1 of the upper layer side (FIG. 22A), a base film 3 such as Ta or TaN described above is formed in the recess 2 (FIG. 22B), and a Ru film 4 is formed on the base film 3 (FIG. 22C). Then, copper (filling material made of copper) 5 is filled in the recess 2 (FIG. 22D), and excess copper 5 is removed by chemical mechanical polishing (CMP) to form a wiring structure of the upper layer side (FIG. 22E). Reference numerals 61 to 63 denote an interlayer insulating film, a copper wiring and a barrier layer, respectively. Reference numeral 64 denotes an etching stopper film (which performs a stopper function during etching) having a function of preventing diffusion of copper.

The reason that the base film 3 is interposed between the interlayer insulating film 1 and the Ru film 4 is as follows. In the SiCOH film that is the interlayer insulating film 1, bonds in the film are cut off by a plasma during etching or asking and C is eliminated from the film. Then, moisture or the like in the atmosphere is coupled to the dangling bonds generated by the elimination of C to form Si—OH. Thus, a surface portion becomes a damage layer. Since the content of C decreases in the damage layer, the relative permittivity increases. For this reason, the surface portion is removed by, for example, hydrofluoric acid. Thus, the surface state of the interlayer insulating film 1 immediately before the barrier film is formed becomes hydrophobic.

Meanwhile, since Ru has large Gibbs free energy of oxide formation, Ru is difficult to bond with O of the SiCOH film. Thus, a thin base film 3 made of Ta or the like and having small Gibbs free energy of oxide formation is thinly formed before the formation of the Ru film 4. In this case, since the Ru film 4 is used as a barrier film, it is less affected by high resistance or poor filling characteristics of the base film 3. However, since the base film 3 is interposed, in addition to the Ru film 4, between copper of the lower layer side and copper of the upper layer side at the bottom of the via hole, it is demanded to reduce the resistance of the conductive path, and further improvements are desired.

Further, in Japanese Patent Application Publication No. 2005-347472 (FIGS. 1 and 3), there is described a problem that when a SiCOH film is plasma etched, a portion of the film is bonded to a recess to generate nucleation of a seed such as methyl group or the like, and the film quality deteriorates when a barrier film is formed in this state. In order to solve this problem, there has been proposed a technique in which the SiCOH film is processed by a hydrogen plasma to remove methyl groups or the like on the surface of the recess and the bonds are terminated with H atoms. In this technique, the surface of the recess to be processed is hydrophilic, and this technique differs from the technique of the present invention.

In addition, in J. Vac. Sci. Technol. A 26(4), July/August 2008 pp. 974-979, there is described a method of forming amorphous alloy of Ru and phosphorus (P) on an insulating film directly without using a base film by chemical vapor deposition (CVD). However, it has also been demonstrated that the adhesion strength of Ru atoms at the interface of Cu is inferior to Cu—Ru bonds of a crystalline structure due to interposed P atoms.

SUMMARY OF THE INVENTION

In view of the above, the present invention provides a technique in which the resistance of a conductive path can be lowered when the conductive path is formed by filling copper in a recess formed in an insulating film such as a SiCOH film.

In accordance with an aspect of the present invention, there is provided a method for manufacturing a semiconductor device, including: adsorbing boron atoms onto a hydrophobic surface of an insulating film containing silicon, carbon, hydrogen and oxygen, which is formed on a substrate and includes a recess formed in the insulating film to expose a conductive path of a lower layer side at a bottom portion thereof, by supplying a gas of a boron compound to the insulating film; forming an adherence film made of a ruthenium (Ru) film directly on the surface of the insulating film onto which the boron atoms are adsorbed; and filling copper serving as a conductive path in the recess.

As an example of the boron compound, there may be used monoborane ($BH_3$), diborane ($B_2H_6$), trimethylborane ($B(CH_3)_3$), triethylborane ($B(C_2H_5)_3$), dicarbadodecaborane ($C_2B_{10}H_{12}$) or decaborane ($B_{10}H_{14}$).

In accordance with another aspect of the present invention, there is provided a method for manufacturing a semiconductor device, including: adsorbing silicon atoms onto a hydrophobic surface of an insulating film containing silicon, carbon, hydrogen and oxygen, which is formed on a substrate and includes a recess formed in the insulating film to expose a conductive path of a lower layer side at a bottom portion thereof, by supplying a gas of a silicon compound to the insulating film; forming an adherence film made of a ruthenium (Ru) film directly on the surface of the insulating film onto which the silicon atoms are adsorbed; and filling copper serving as a conductive path in the recess.

As an example of the silicon compound, there may be used monosilane ($SiH_4$) or disilane ($Si_2H_6$).

In accordance with still another aspect of the present invention, there is provided a method for manufacturing a semiconductor device, including: adsorbing aluminum atoms onto a hydrophobic surface of an insulating film containing silicon, carbon, hydrogen and oxygen, which is formed on a substrate and includes a recess formed in the insulating film to expose a conductive path of a lower layer side at a bottom portion thereof, by supplying a gas of an organic compound containing aluminum to the insulating film; forming an adherence film made of a ruthenium (Ru) film directly on the surface of the insulating film onto which the aluminum atoms are adsorbed; and filling copper serving as a conductive path in the recess.

As an example of the organic compound containing aluminum, there may be used trimethyl aluminum.

According to the present invention, the recess is formed, and boron (B) atoms, silicon (Si) atoms or aluminum (Al) atoms are adsorbed onto the surface of an insulating film formed of a SiCOH film whose surface is hydrophobic. Accordingly, a Ru film made of metal may be formed, so to speak, directly on the surface of the recess through B atoms, Si atoms or Al atoms. Thus, since the base film under the Ru film becomes unnecessary, it is possible to increase the volume of copper in the recess. As a result, it is possible to reduce the resistance of the conductive path formed by embedding copper in the recess, and it is suitable as a method of manufacturing a semiconductor device having a structure of refining the line width of the pattern.

BRIEF DESCRIPTION OF THE DRAWINGS

FIGS. 2A to 2D are explanatory views showing step by step a series of processes for forming a copper wiring in accordance with the first embodiment of the present invention.

FIG. 14 is SEM photographs taken to confirm the effect of Evaluation Test 1.

FIG. 16 is SEM photographs taken to confirm the effect of Evaluation Test 2.

FIG. 17 is SEM photographs taken to confirm the effect of Evaluation Test 2.

FIGS. 22A to 22E are explanatory views showing step by step a series of conventional processes for forming a copper wiring.

DETAILED DESCRIPTION OF THE EMBODIMENTS

First Embodiment

Figure 1A:
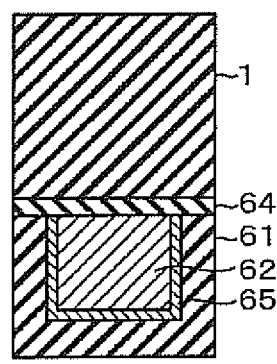
FIGS. 1A to 1C are explanatory views showing a process performed in a previous stage of a surface treatment which is performed using a diborane gas on the surface of an insulating film in accordance with a first embodiment of the present invention.

A method for manufacturing a semiconductor device according to a first embodiment of the present invention will be described with reference to the drawings. FIGS. 1A to 2D show a process of forming an upper layer side wiring structure on a lower layer side wiring structure as a manufacturing step of the semiconductor device, and the same portions as those shown in FIGS. 22A to 22D described above are denoted by the same reference numerals. Reference numeral 65 denotes a barrier layer, e.g., a Ta film.

Figure 1B:
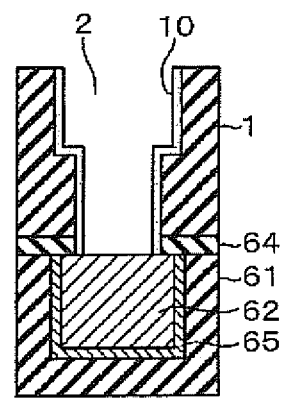

First, an interlayer insulating film 1 that is a SiCOH film is formed on a substrate that is, e.g., a semiconductor wafer, in which the lower layer side wiring structure is formed (FIG. 1A). For example, the film formation is performed by a plasma CVD method using diethoxymethylsilane (DEMS) as a processing gas. Then, a recess 2 including a trench to be a wiring groove and a via hole for forming an electrode, which is a connection portion of the lower layer side wiring, is formed in the interlayer insulating film 1 (FIG. 1B). For example, the step of forming the recess 2 may be carried out by forming a resist pattern and combining a plurality of stages of plasma etching using a sacrificial layer. The line width of the trench is designed to be, for example, 20 to 50 nm, and the diameter of the via hole is designed to be, for example, 20 to 50 nm.

Then, cleaning is performed by using cleaning liquid to remove residues adhered to the surface of the substrate during asking and etching for forming the recess 2.

Figure 1C:
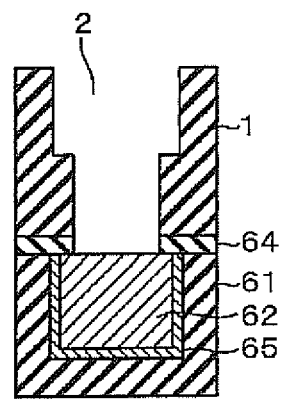

During the formation of the recess 2, a surface portion of the interlayer insulating film (SiCOH film) 1 is damaged (bond is cleaved) as described above by a plasma. Accordingly, C is desorbed from the film. Then, Si—OH groups are formed due to moisture in the air. In FIG. 1B, reference numeral 10 denotes a damage layer. The damage layer 10 has a high relative permittivity, and polymers of etching residues remain on the surface of the interlayer insulating film 1 after etching. Thus, the damage layer 10 is removed, for example, by a method such as wet etching using a hydrofluoric acid solution (FIG. 1C).

The substrate, which has been processed as described above, subsequently undergoes a series of processes for filling copper including a surface treatment using a diborane gas as shown in FIGS. 2A to 2D. First of all, a processing module for performing the surface treatment will be described with reference to FIG. 3.

Figure 3:
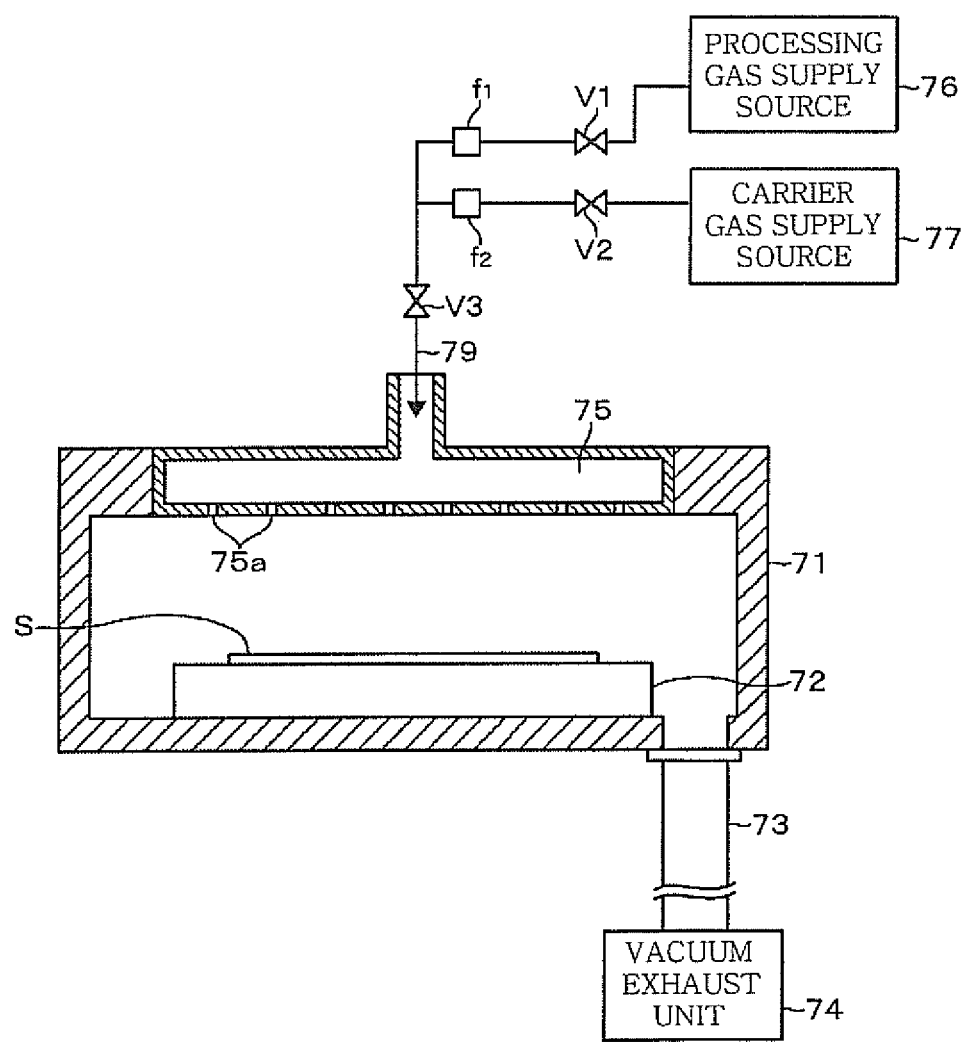
FIG. 3 is a vertical cross-sectional view showing an example of an apparatus for performing the surface treatment using the diborane gas.

In FIG. 3, reference numeral 71 denotes a processing chamber that is a vacuum chamber. A stage 72 having a heater (not shown) as a heating unit is provided on the bottom surface of the processing chamber 71, and an exhaust pipe 73 is connected to a bottom portion of the processing chamber 71. A vacuum exhaust unit 74 is disposed on the downstream side of the exhaust pipe 73. A gas shower head 75 is provided in an upper portion of the processing chamber 71, and a plurality of gas injection holes 75a for uniformly introducing a gas into the processing atmosphere are formed in a lower surface portion of the gas shower head 75.

A gas supply passage 79 is connected from the outside to the gas shower head 75. An upstream end of the gas supply passage 79 is branched and connected to a processing gas supply source 76 and a carrier gas supply source 77. Reference numerals V1 to V3 denote valves, and reference numerals f1 and f2 denote flow rate control units. For example, diborane ($B_2H_6$) which is a B (boron) compound is used as a processing gas. For example, helium (He) is used as a carrier gas.

In the processing module, a substrate S is placed on the stage 72 from the outside by lift pins (not shown). While the substrate S is heated by the heater, a diborane gas using He as a carrier is supplied into the processing chamber 71 through the gas supply passage 79 and the gas shower head 75. The temperature of the substrate S needs to be set to a temperature equal to or greater than a temperature at which B atoms are adsorbed on the SiCOH film, and is set to be, e.g., 350° C. The temperature of the substrate S may be equal to or greater than a temperature at which diborane is thermally decomposed. In addition, the pressure in the processing chamber 71 is set to be, e.g., 2667 Pa.

FIG. 2A shows a surface state of the substrate S after it has been surface-treated with a diborane gas.

Thus, after adsorption of the B atoms to the surface of the interlayer insulating film 1, a Ru film 4 is formed on the surface of the substrate, i.e., the surface of the interlayer insulating film 1 onto which B atoms are adsorbed and the surface of a copper wiring 62 of the lower layer side, which is exposed at the bottom of the via hole (FIG. 2B).

Figure 4:
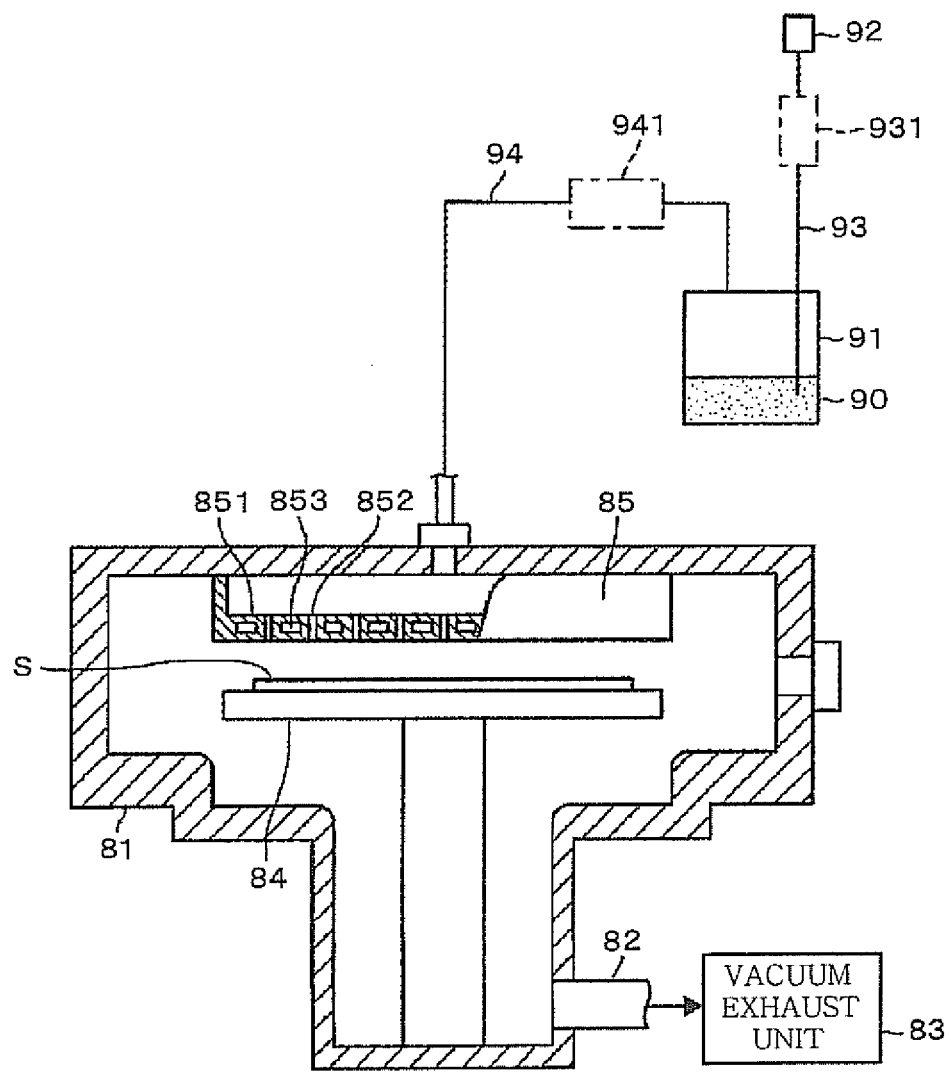
FIG. 4 is a vertical cross-sectional view showing an example of a module (apparatus) for forming a Ru film.

FIG. 4 shows a processing module which forms a thermal CVD apparatus for forming the Ru film 4. Reference numeral 81 denotes a processing chamber which is a mushroom-shaped vacuum chamber, and reference numeral 82 denotes an exhaust pipe. Reference numeral 83 denotes a vacuum exhaust unit, and reference numeral 84 denotes a stage in which a heater (not shown) is embedded. Reference numeral 85 denotes a gas shower head for supplying a processing gas to the substrate S on the stage 84. The gas shower head 85 includes a shower plate 851 having a plurality of gas injection holes 852 for uniformly supplying a gas into the processing atmosphere. The shower plate 851 has, for example, a flow path 853 for temperature control fluid, which forms a temperature control unit.

A processing gas supply line 94 is connected from the outside to the gas shower head 85. A raw material bottle 91 is connected to an upstream end of the processing gas supply line 94. In the raw material bottle 91, powder 90 made of a precursor of Ru, e.g., $Ru_3(CO)_{12}$, is accommodated. One end of a carrier gas supply pipe 93 is plunged into the powder 90. Meanwhile, a supply source 92 of the carrier gas, e.g., CO gas is connected to the other end of the carrier gas supply pipe 93. Then, when the CO gas as a carrier gas is supplied to the raw material bottle 91, $Ru_3(CO)_{12}$ is sublimated, and a gas thereof is fed to the gas shower head 85. Reference numerals 931 and 941 denote a gas supply device group such as a valve and a flow rate control unit.

In this processing module, the substrate S is loaded onto the stage 84 from the outside by lift pins (not shown), and heated to, e.g., 150 to 300° C. Then, $Ru_3(CO)_{12}$ gas is supplied from the raw material bottle 91 using the CO gas as a carrier gas to the processing chamber 81 through the processing gas supply line 94 and the gas shower head 85. Then, CVD reaction occurs on the substrate S to form the Ru film 4. The thickness of the Ru film 4 is set to, e.g., 2 nm.

Figure 5:
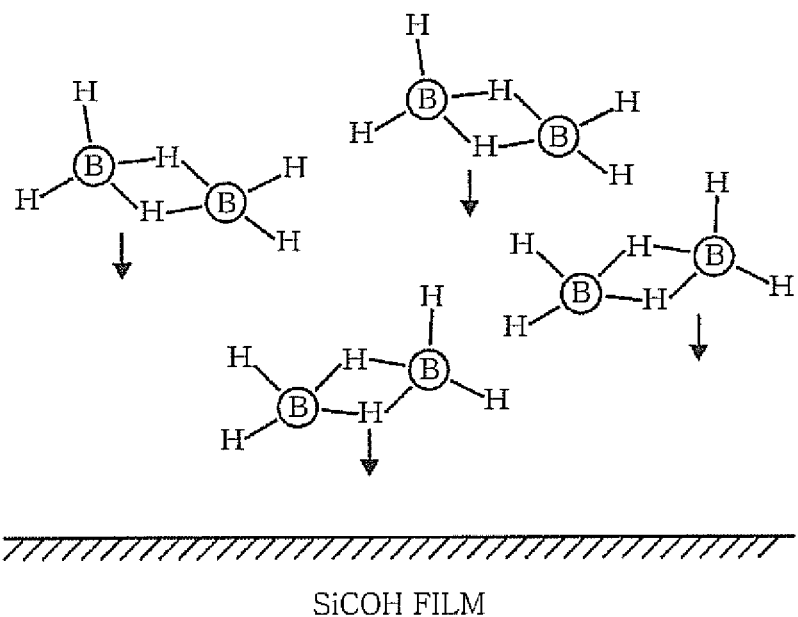
FIG. 5 is an explanatory view schematically showing the surface of the insulating film and its vicinity in the surface treatment performed using the diborane gas in the first embodiment.
Figure 6:
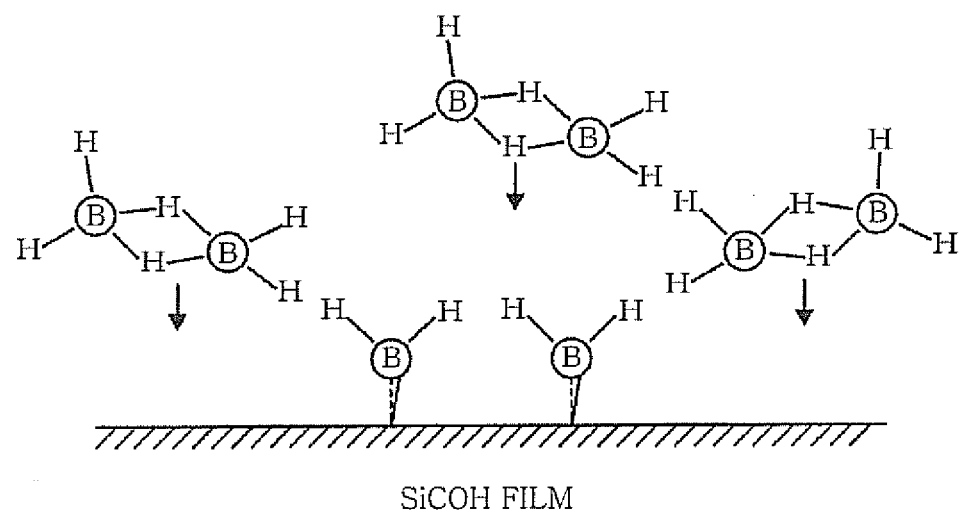
FIG. 6 is an explanatory view schematically showing the surface of the insulating film and its vicinity in the surface treatment performed using the diborane gas in the first embodiment.

In this case, when the SiCOH film (interlayer insulating film 1) is surface-treated by a diborane gas, as is clear from the examples described later, Ru is deposited favorably on the SiCOH film, and the mechanism is presumed as follows. When diborane is supplied to the SiCOH film on the substrate S as shown in FIG. 5, diborane molecules are adsorbed onto the surface of the SiCOH film, and two H atoms present between two B atoms are eliminated from diborane. The diborane molecule is dissociated into $BH_2$ molecules with the B atom having two free bonds (dangling bonds). Then, as shown in FIG. 6, each of two free bonds of the B atom is bonded to any atom of the surface of the SiCOH film to form a $BH_2$ layer.

Figure 7:
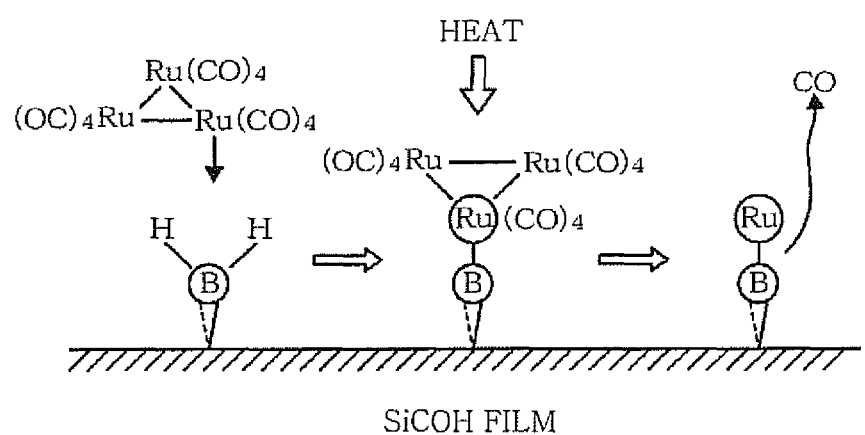
FIG. 7 is an explanatory view schematically showing the surface of the insulating film and its vicinity in a process of forming the Ru film in the first embodiment.

Therefore, B atoms on the SiCOH film become Ru adsorption sites. That is, since B has the properties of metal, B may be bonded to Ru that is metal through free electrons. This phenomenon is considered as follows. That is, when the Ru film is formed by supplying the $Ru_3(CO)_{12}$ gas to the substrate S, CO gas is generated as a by-product. In the reaction in this case, it is assumed that free electrons in the SiCOH film move to $Ru_3(CO)_{12}$ through B atoms, Ru compounds are adsorbed to the B atoms and decomposed to be Ru atoms, and the CO gas is generated at the same time. The state of the surface of the SiCOH film at this time is shown in FIG. 7. Therefore, by performing diborane gas processing on the SiCOH film before the Ru film is formed, nucleation of Ru in the initial stage of the film formation is promoted, and a continuous film can be formed. Further, when the Ru film 4 is formed using the $Ru_3(CO)_{12}$ gas and CO gas, it is possible to form the film while moderately suppressing the reaction, so that the film thickness can be accurately controlled.

As a raw material of Ru, it is possible to use, e.g., Ru organic compounds disclosed in Japanese Patent Application Publication No. 2005-347472 other than the above-described raw material. Further, as the process for forming the Ru film, it is not limited to the CVD method. For example, a so-called atomic layer deposition (ALD) method may be used to obtain a laminated film by laminating atomic layers or molecular layers one by one by alternately supplying a gas which is a precursor of Ru and a reactive gas which reacts with the precursor to the substrate while performing vacuum evacuation during gas switching.

Then, by performing sputtering of copper on the substrate S, copper 5 is filled in the recess 2 (FIG. 2C). The step of filling the copper 5 may be performed such that after a seed layer of copper is formed by sputtering in the recess 2, copper is filled by a plating method. After the copper 5 is filled in the recess 2, for example, the substrate S is annealed by being heated to 150° C. in a vacuum atmosphere, thereby stabilizing the grain size of the copper 5. This is to reduce the resistance value of the copper 5. In the following description, in order to simplify the description, reference numeral 5 is assigned to any of copper, copper wiring and copper electrode.

After the step of filling the copper, the surface of the substrate S is polished by CMP to remove excess copper. Thus, a copper wiring structure of the upper layer side is obtained (FIG. 2D).

Figure 8:
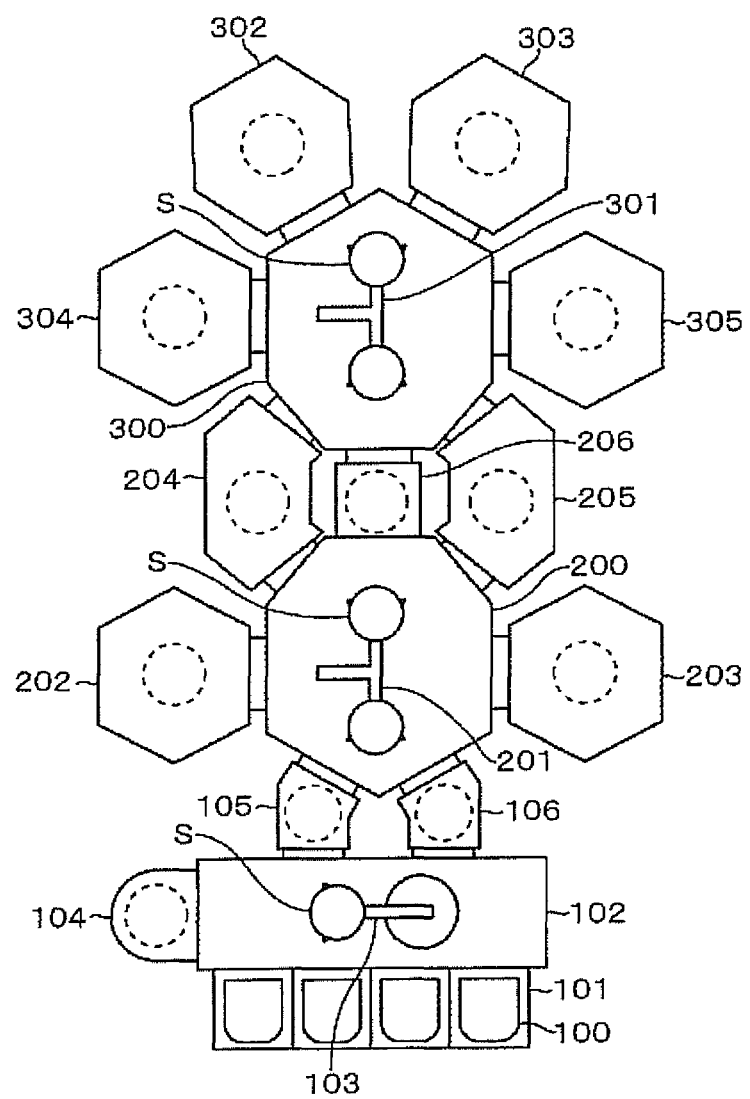
FIG. 8 is a schematic plan view showing a substrate processing apparatus that is a multi-chamber system for performing a series of processes in the embodiment of the present invention.

A substrate processing system for performing the steps shown in FIGS. 2A to 2C is shown in FIG. 8. Reference numeral 101 denotes a loading/unloading port for loading and unloading a transfer container 100, and reference numeral 102 denotes an atmospheric transfer chamber. Reference numeral 103 denotes an atmospheric transfer arm, and reference numeral 104 denotes a position alignment module for adjusting the orientation and the center position of the substrate (semiconductor wafer) S. If the transfer container 100 is a FOUP, a lid opening/closing mechanism of the FOUP and the like are interposed between the loading/unloading port 101 and the atmospheric transfer chamber 102. Processing blocks are hermetically connected to the back side of the atmospheric transfer chamber 102 through load-lock chambers 105 and 106. The substrate S is accommodated in the transfer container 100 which is loaded to the loading/unloading port 101. At this time, the substrate S is in a state (FIG. 1C) after the damage layer 10 of the interlayer insulating film 1 is removed.

The processing blocks include a first vacuum transfer chamber 200 which is surrounded by and connected to processing modules 202, 203, 204 and 205 and has a first substrate transfer arm 201, and a second vacuum transfer chamber 300 which is surrounded by and connected to processing modules 302, 303, 304 and 305 and the processing modules 204 and 205 and has a second substrate transfer arm 301. The processing modules 204 and 205 are pre-processing modules for processing the substrate S shown in FIG. 1C to a state in which the process of FIGS. 2A to 2D can be performed. An inlet and an outlet of each of the processing modules 204 and 205 are connected to the first vacuum transfer chamber 200 and the second vacuum transfer chamber 300, respectively. Further, reference numerals 304 and 305 are surface treatment modules, for performing the surface treatment of the substrate S using diborane, shown in FIG. 3. Reference numerals 302 and 303 are thermal CVD modules for forming the Ru film 4 shown in FIG. 2B, and reference numerals 202 and 203 are sputter modules for filling copper.

In the substrate processing system, after the substrate S taken out from the transfer container 100 is position-aligned by the position alignment module 104, the substrate S is loaded into the pre-processing module 204 (or 205) through the load-lock chamber 105 (or 106) and the first vacuum transfer chamber 200. In the pre-processing module 204 (or 205), residues during etching or asking and moisture of the surface of the insulating film are removed. Then, the substrate S is loaded into the diborane surface treatment module 304 (or 305) through the second vacuum transfer chamber 300, and the adsorption of B atoms onto the SiCOH film is performed. Then, the substrate S is loaded into the CVD module 302 (or 303) after passing through the second vacuum transfer chamber 300 again, and the film formation of the Ru film 4 is performed. Then, the substrate S is loaded into the sputter module 202 (or 203) through the second vacuum transfer chamber 300, an exchange chamber 206 and the first vacuum transfer chamber 200. Then, in the substrate S, the copper 5 is filled in the recess 2 by copper sputtering. Then, the substrate S is returned to the transfer container 100 through the first vacuum transfer chamber 200, the load-lock chamber 105 (or 106) and the atmospheric transfer chamber 102.

As B compounds used to adsorb the B atoms onto the surface of the interlayer insulating film 1, monoborane ($BH_3$), trimethylborane ($B(CH_3)_3$), triethylborane ($B(C_2H_5)_3$), dicarbadodecaborane ($C_2B_{10}H_{12}$), decaborane ($B_{10}H_{14}$) or the like may be used without being limited to the diborane as described above. As the carrier gas for the B compounds, $H_2$, argon or the like may be used in addition to He.

Second Embodiment

In this embodiment, the surface of the SiCOH film is treated by using a silane-based gas instead of the B compound gas in the first embodiment. As a module for performing this surface treatment, there is a module which uses a silane compound gas as a processing gas in the surface treatment module 304 (or 305) of FIG. 8 of the first embodiment.

Figure 9:
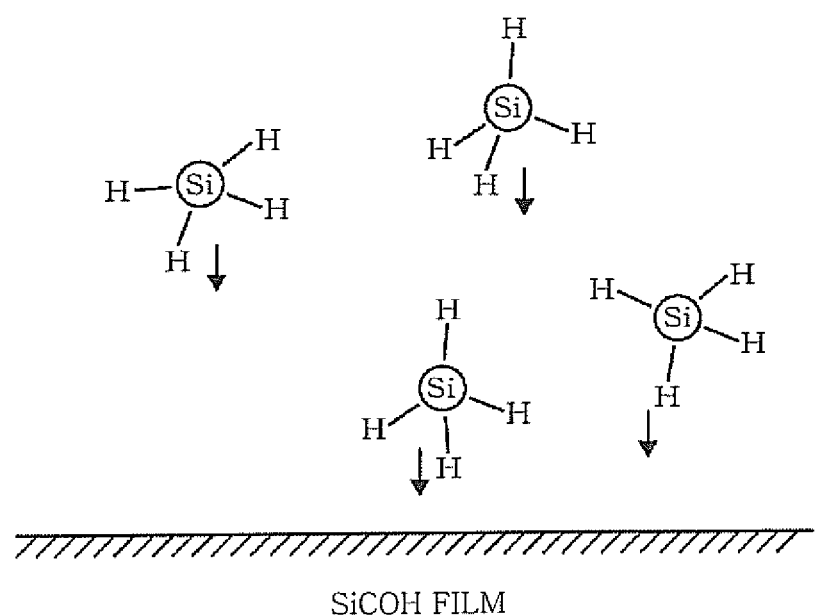
FIG. 9 is an explanatory view schematically showing the surface of the insulating film and its vicinity in the surface treatment performed using a monosilane gas in a second embodiment.
Figure 10:
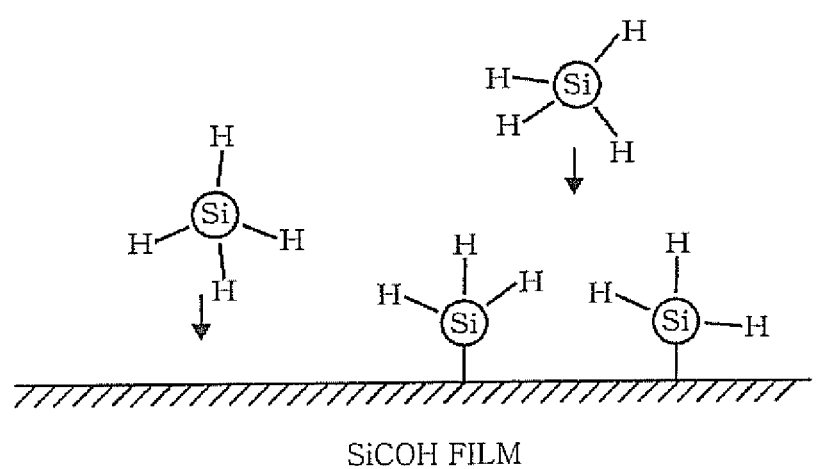
FIG. 10 is an explanatory view schematically showing the surface of the insulating film and its vicinity in the surface treatment performed using a monosilane gas in the second embodiment.

When the surface treatment of the SiCOH film is performed with a monosilane gas, as is clear from the examples described later, Ru is favorably deposited on the SiCOH film, and this mechanism is presumed as follows. As in the first embodiment, when supplying monosilane ($SiH_4$) to the SiCOH film on the substrate S as shown in FIG. 9, monosilane molecules are adsorbed onto the surface of the SiCOH film, and hydrogen groups (—H) are desorbed from monosilane. As shown in FIG. 10, the monosilane molecule from which hydrogen group is desorbed is bonded to any atom of the surface of the SiCOH film, and a $SiH_3$ layer is formed.

Thus, Si atoms on the SiCOH film become Ru adsorption sites. That is, since Si has properties of metal, it may be bonded to Ru that is metal through the free electrons. Further, as in the first embodiment, when a Ru film is formed by supplying the above-described $Ru_3(CO)_{12}$ gas to the substrate S, CO gas is generated as a by-product. In the reaction in this case, it is assumed that free electrons in the SiCOH film move to $Ru_3(CO)_{12}$ through Si atoms, Ru compounds are adsorbed to the Si atoms and decomposed to be Ru atoms, the CO gas is generated at the same time. Further, as in the first embodiment, nucleation of Ru in the initial stage of the film formation is promoted, and a continuous film can be formed.

In this case, as Si compounds used to adsorb the Si atoms to the surface of the interlayer insulating film 1, disilane ($Si_2H_6$), dichrolosilane ($SiH_2Cl_2$) or the like may be used without being limited to the monosilane as described above.

Further, it is presumed that the same results can be obtained by using P atoms as a substitute for the B atoms or Si atoms. That is, P is adsorbed onto the substrate S by using phosphine ($PH_3$) as a source gas instead of the surface treatment using diborane which is performed in the apparatus of FIG. 3 in the step of FIG. 2A.

Since P also has the properties of metal, P is likely to be bonded to Ru through free electrons. Thus, since a Ru film can be formed on the surface of the interlayer insulating film 1 using P atoms as Ru adsorption sites on the surface of the insulating film, the same results can be obtained.

Third Embodiment

In this embodiment, the surface treatment of the SiCOH film is performed by using a trimethyl aluminum (TMA) gas instead of the B compound gas in the first embodiment, or the silane-based gas in the second embodiment. The TMA gas is carried with a carrier gas, e.g., an inert gas and supplied into the processing chamber 71 from the gas shower head 75 shown in FIG. 3, for example.

Figure 11:
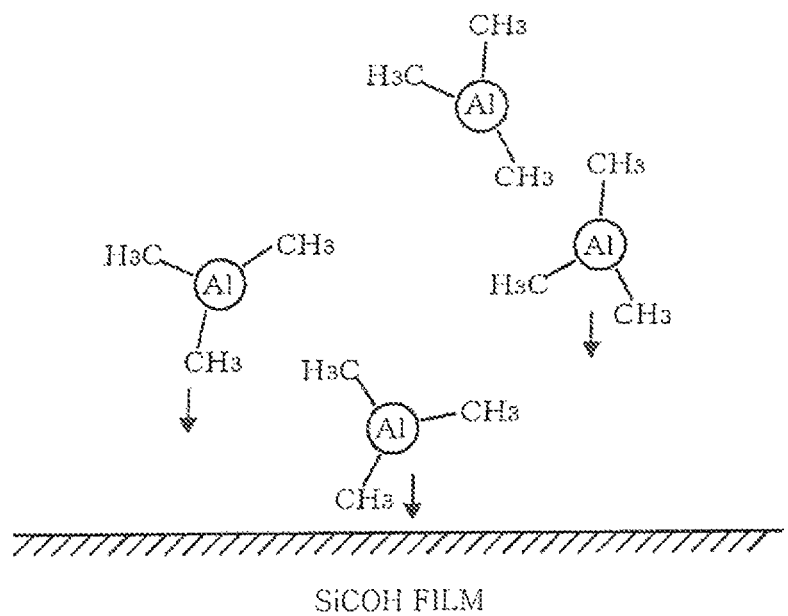
FIG. 11 is an explanatory view schematically showing the surface of the insulating film and its vicinity in the surface treatment performed using TMA in a third embodiment.
Figure 12:
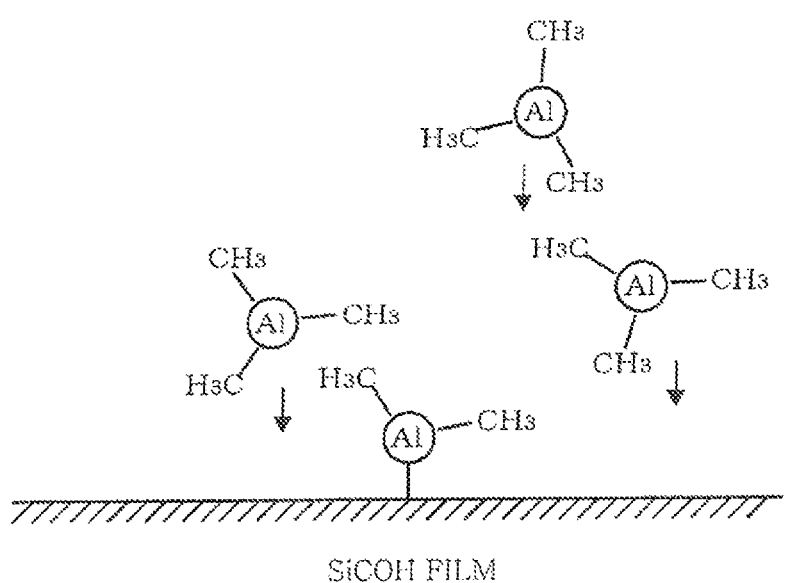
FIG. 12 is an explanatory view schematically showing the surface of the insulating film and its vicinity in the surface treatment performed using TMA in the third embodiment.

When the surface treatment of the SiCOH film is performed by the TMA gas, as is clear from the examples described later, the Ru film is deposited favorably on the SiCOH film, and this mechanism is presumed as follows. As in the first embodiment, when the TMA gas is supplied to the SiCOH film on the substrate S as shown in FIG. 11, at the surface of the SiCOH film, TMA molecules are adsorbed onto the surface of the SiCOH film, and one methyl group (—$CH_3$) is desorbed from the TMA. Then, as shown in FIG. 12, the molecule from which a methyl group is desorbed is bonded to any atom of the surface of the SiCOH film, and a layer of $Al(CH_3)_2$ is formed.

Thus, Al atoms on the SiCOH film become Ru adsorption sites. That is, since Al is metal, Al may be bonded to Ru that is metal through the free electrons. Further, as in the first embodiment, when a Ru film is formed by supplying the above-described $Ru_3(CO)_{12}$ gas to the substrate S, CO gas is generated as a by-product. In the reaction in this case, it is assumed that free electrons in the SiCOH film move to $Ru_3(CO)_{12}$ through Al atoms, Ru compounds are adsorbed to the Al atoms and decomposed to be Ru atoms, and the CO gas is generated at the same time. Accordingly, as in the first embodiment, nucleation of Ru in the initial stage of the film formation is promoted, and a continuous film can be formed.

Further, in the Ru film formation using the Al atoms as the adsorption sites, by alternately laminating Ru film and Al film with the molecular basis by using the above-described ALD method, it is possible to improve a barrier effect for the copper 5 to be filled in the recess of the interlayer insulating film 1 in the subsequent step.

In the third embodiment described above, the TMA gas has been used as a processing gas on the surface of the substrate, but an adsorption effect of Al to the surface of the substrate can be obtained even by using a gas containing organic compounds including Al instead of the TMA.

EXAMPLES

<Evaluation Test 1>

By using a $SiO_2$ film that is a thermal oxide film as an insulating film material, evaluation tests were conducted for the process of the SiCOH film.

A substrate on which the $SiO_2$ film was formed was heated to 350° C., and the surface treatment was performed by using diborane in the same manner as in the first embodiment. Then, the film formation of the Ru film was carried out on the surface of the $SiO_2$ film. This process is referred to as Example 1. Further, a substrate on which the $SiO_2$ film was formed was heated to 350° C., and the surface treatment was performed by using silane in the same manner as in the second embodiment. Then, the film formation of the Ru film was carried out on the surface of the $SiO_2$ film. This process is referred to as Example 2.

Meanwhile, the film formation of the Ru film was performed directly on the surface of the $SiO_2$ film. This process is referred to as Comparative Example 1.

Figure 13:
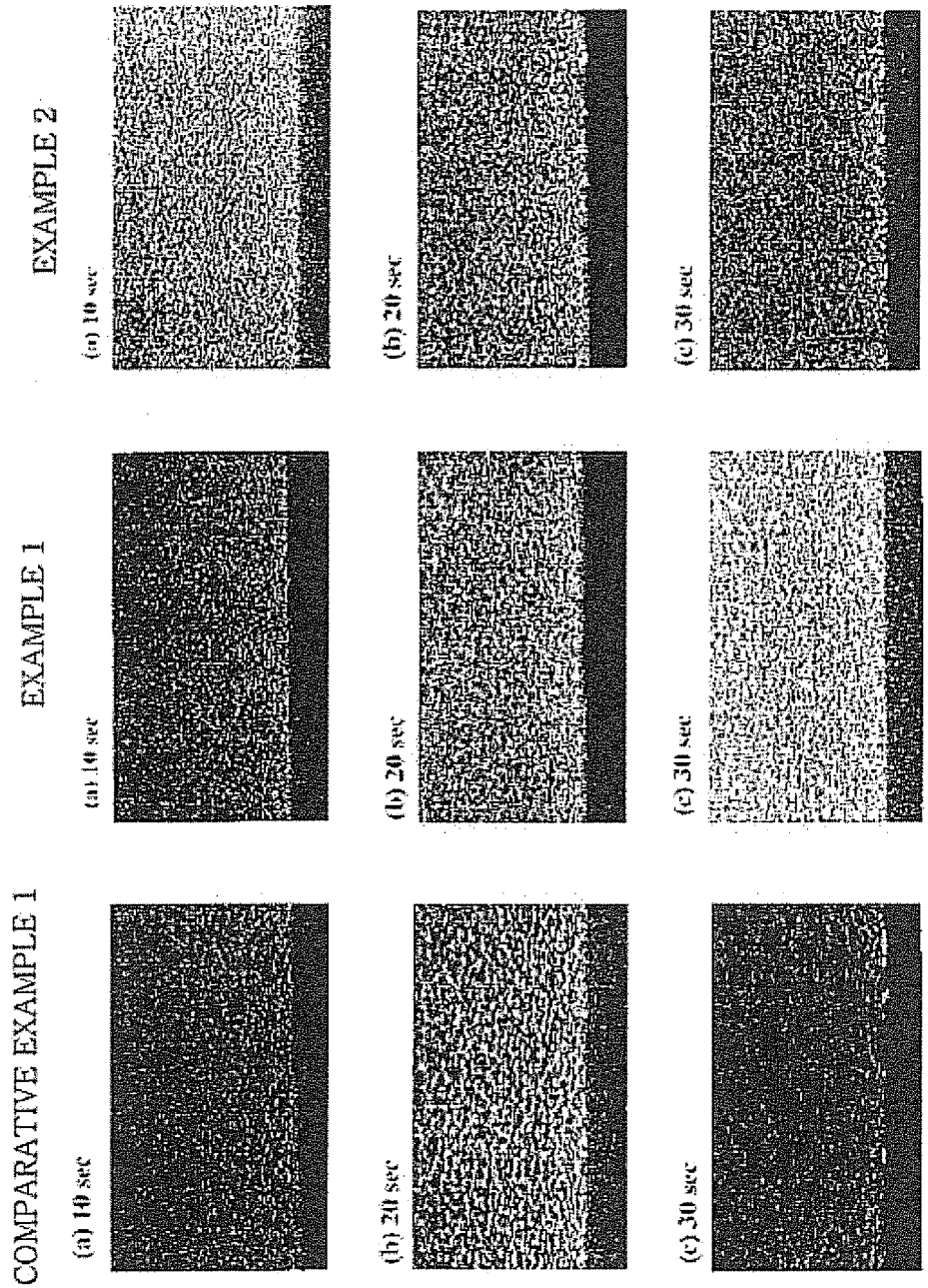
FIG. 13 is SEM photographs taken to confirm the effect of Evaluation Test 1.

Then, from the start of the process for forming the Ru film, the substrate was observed by SEM photographs at the respective time points after 10 seconds, 20 seconds and 30 seconds. The observation results are shown in FIGS. 13 and 14. FIG. 13 represents photographs showing oblique views of the surfaces of film formation samples. FIG. 14 represents photographs showing plan views of the surfaces of film formation samples. In FIG. 14, a location where the Ru film is formed is in white, and a location where the Ru film is not formed is in black. Further, numbers are the percentages of the white area to the whole area.

As can be seen from FIG. 13, in Comparative Example 1, Ru particle lumps are present, and irregularities are seen in the surface, but in Examples 1 and 2, the particles of Ru are densely concentrated. Meanwhile, it can be seen from the black and white contrast and percentages shown in FIG. 14 that a Ru film is formed to have a high uniformity in Examples 1 and 2 compared to Comparative Example 1.

In the case of forming a Ru film directly on the surface of the $SiO_2$ film, it is estimated that Ru atoms are hardly adsorbed because the $SiO_2$ film has no adsorption sites and is non-metallic. On the other hand, in the case where the surface treatment is performed as described above on the surface of the $SiO_2$ film before a Ru film is formed, it is estimated as follows. Nuclear growth of Ru proceeds around the Ru atoms initially bonded to the B atoms or Si atoms adsorbed on the surface of the $SiO_2$ film. A plurality of Ru nuclei grown as the reaction proceeds are bonded to each other to form a uniform Ru film.

Figure 15:
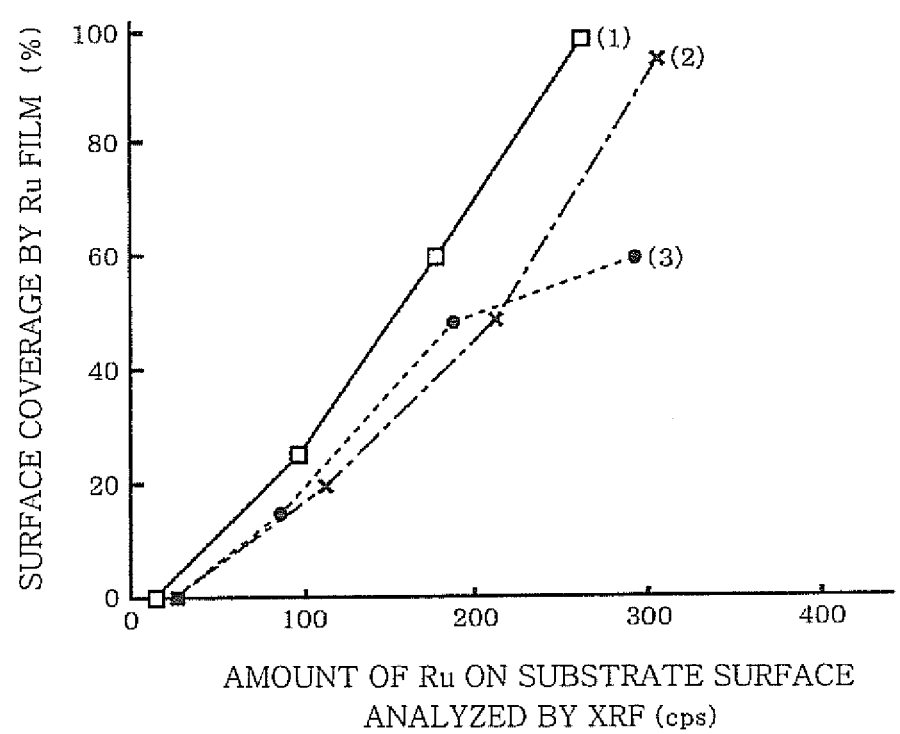
FIG. 15 is a graph showing the effect of Evaluation Test 1.

FIG. 15 is a graph in which the horizontal axis represents the amount of Ru analyzed by X-ray fluorescence analysis (XRF), and the vertical axis represents the coverage by the Ru film on the surface of the substrate in Examples 1 and 2 and Comparative Example 1. The solid line (1) shows a case of forming a Ru film after the surface of the $SiO_2$ film was treated with diborane gas, the dashed dotted line (2) shows a case of forming a Ru film after the surface of the $SiO_2$ film was treated with silane gas, and the dotted line (3) shows a case of forming a Ru film on a silicon oxide film that is a thermal oxide film obtained by heat-treating the surface of the $SiO_2$ film. It can be also seen from the graph that the surface treatment of the $SiO_2$ film of the present invention effectively improves the film formation efficiency of the Ru film on the $SiO_2$ film.

<Evaluation Test 2>

A substrate (silicon wafer) on which a $SiO_2$ film was formed was heated to 350° C., and the surface treatment was performed by using TMA in the same manner as in the third embodiment. Then, the film formation of a Ru film was carried out on the surface of the $SiO_2$ film. This process is referred to as Example 3.

Meanwhile, the film formation of the Ru film was performed on the silicon oxide film which is formed by thermal oxidation. This process is referred to as Comparative Example 2.

Then, from the start of the process for forming the Ru film, the substrate was observed by SEM photographs at the respective time points after 10 seconds, 30 seconds and 60 seconds. The observation results are shown in FIGS. 16 and 17. FIG. 16 represents photographs showing oblique views of the surfaces of film formation samples. FIG. 17 represents photographs showing plan views of the surfaces of film formation samples in the same manner as FIG. 14. In FIG. 17, a location where the Ru film is formed is in white, and a location where the Ru film is not formed is in black. Further, numbers are the percentages of the white area to the whole area.

As can be seen from FIG. 16, in Comparative Example 2, Ru particle lumps are present, and irregularities are seen in the surface, but in Example 3, the particles of Ru are densely concentrated. Further, it can be seen from the black and white contrast and percentages shown in FIG. 17 that a Ru film is formed to have a high uniformity in Example 3 compared to Comparative Example 2.

Figure 18:
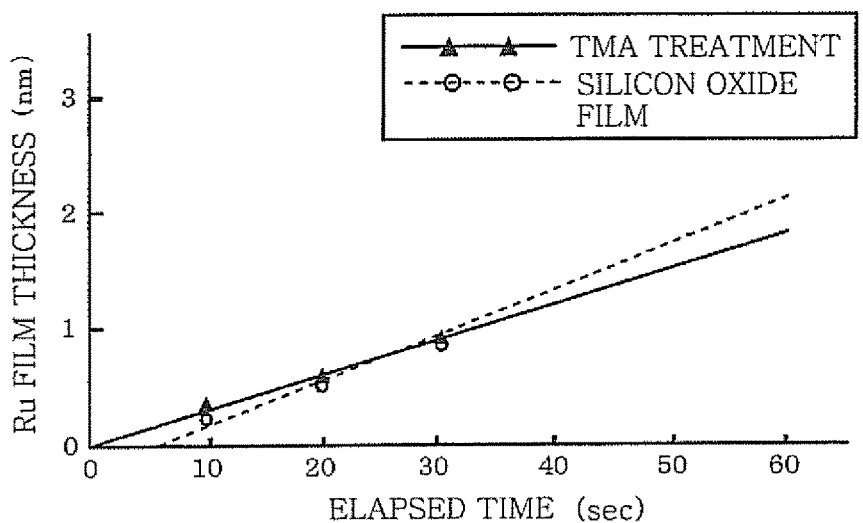
FIGS. 18 to 21 are graphs showing the effect of Evaluation Test 2.

Further, we have also examined a relationship between the thickness of the Ru film and the elapsed time from the start of the process for forming the Ru film for each of Example 3 and Comparative Example 2. The results are shown in FIG. 18. In a graph of FIG. 18, the horizontal axis represents the elapsed time and the vertical axis represents the film thickness of the Ru film. For each of Example 3 and Comparative Example 2, considering a relationship between the film thickness and the elapsed time on the basis of a straight line obtained by the linear approximation based on the plot, the deposition of the Ru film begins immediately after the start of the film formation in Example 3. On the other hand, in Comparative Example 2, the deposition of the Ru film begins after a while after the start of the film formation, and a time delay occurs.

Figure 19:
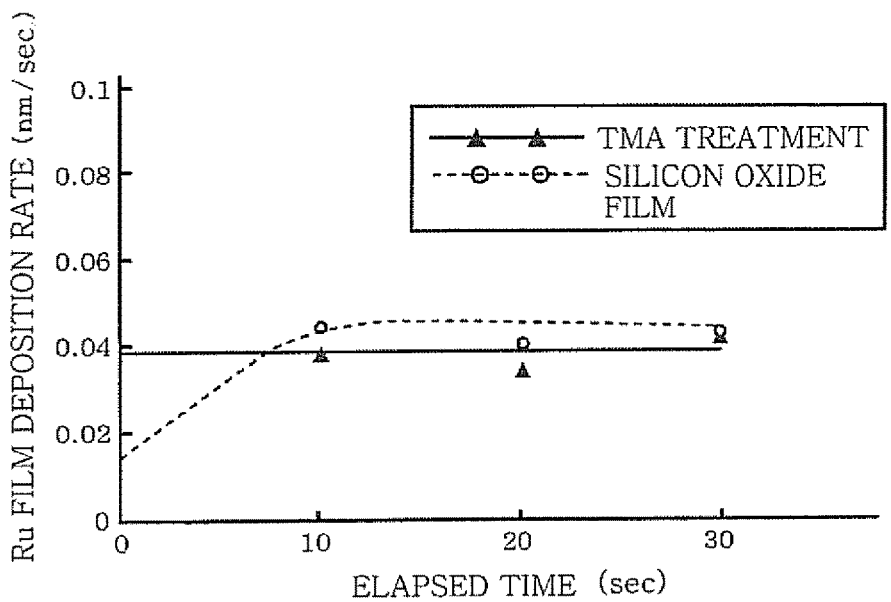
Figure 20:
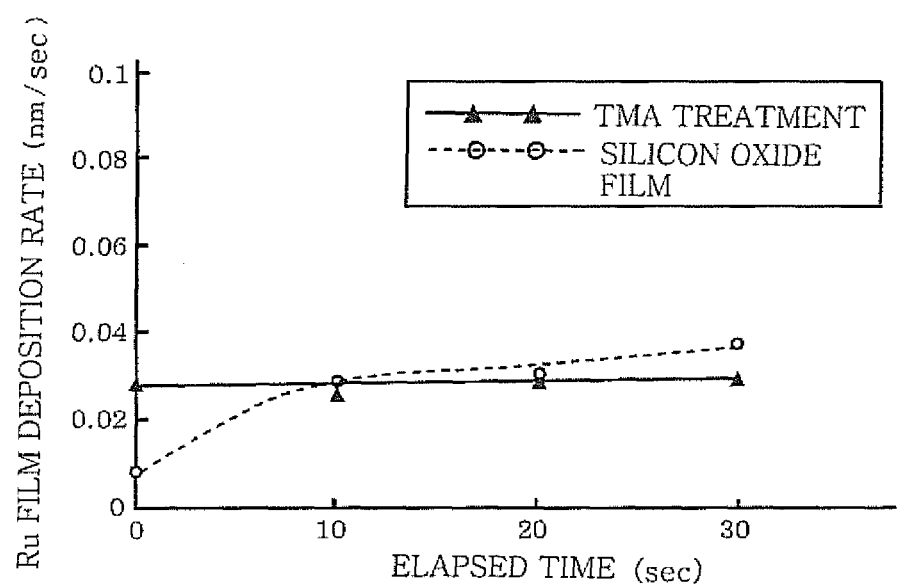

Further, for each of Example 3 and Comparative Example 2, we have examined a relationship between the elapsed time and the deposition rate of the Ru film. The results are shown in FIGS. 19 and 20. The graphs of FIGS. 19 and 20 show the relationship in the center of the substrate and the average value of the entire substrate, respectively. The results of Example 3 are shown by the solid lines and the results of Comparative Example 2 are shown by the dotted lines. In Comparative Example 2, it can be seen that the deposition rate of the Ru film is low in the initial stage and increases over time. On the other hand, in Example 3, it can be seen that the deposition rate of the Ru film is approximately constant over time. From the change of the deposition rate of the Ru film, it can be seen that the deposition of the Ru film is uneven on the surface of the substrate in Comparative Example 2, and the Ru film is deposited uniformly on the surface of the substrate in Example 3.

Figure 21:
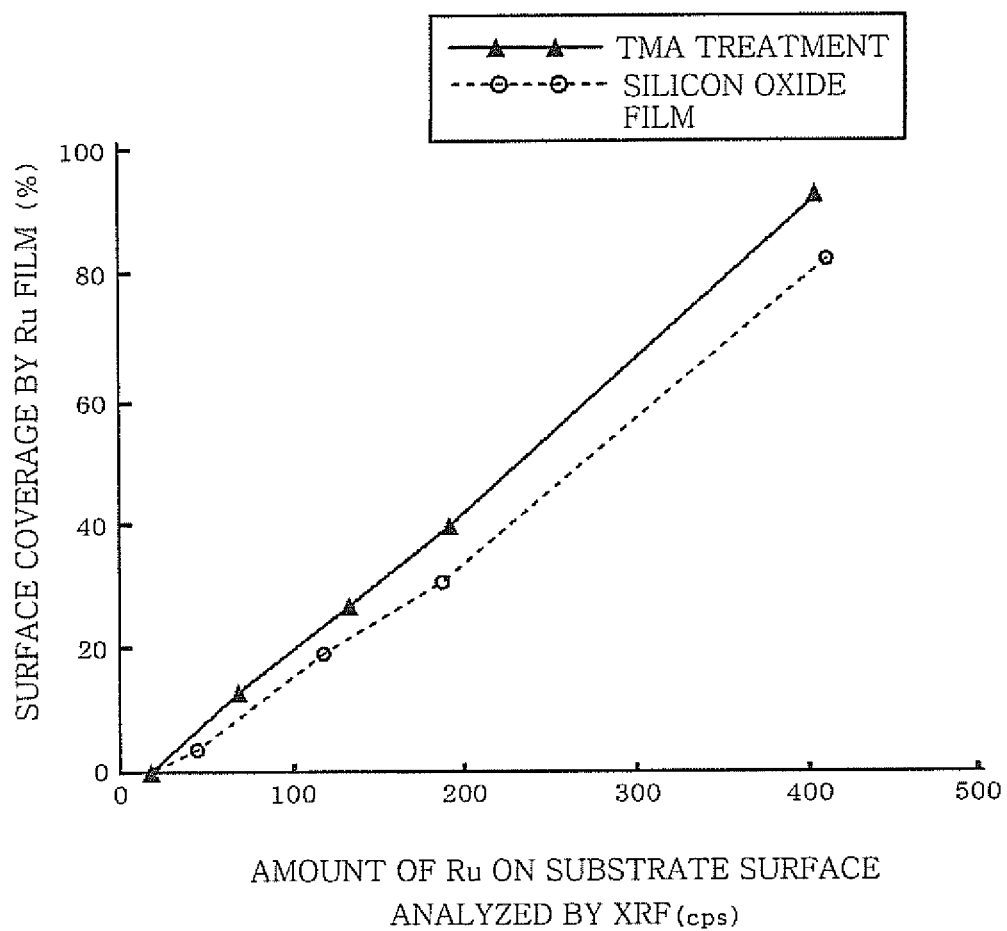

Further, FIG. 21 is a graph in which the horizontal axis represents the amount of Ru analyzed by X-ray fluorescence analysis (XRF) and the vertical axis represents the coverage by the Ru film on the surface of the substrate. The results of Example 3 are shown by the solid line and the results of Comparative Example 2 are shown by the dotted line. From the graph, it is suggested that the surface treatment of the $SiO_2$ film by TMA improves the film formation efficiency of the Ru film on the $SiO_2$ film.

As for Evaluation Tests 1 and 2, the $SiO_2$ film was used as an evaluation target, but similar results can be obtained obviously even by using a SiCOH film.

What is claimed is:

1. A method for manufacturing a semiconductor device, comprising:
    adsorbing boron atoms or aluminum atoms onto a hydrophobic surface of an insulating film containing silicon, carbon, hydrogen and oxygen, which is formed on a substrate and includes a recess formed in the insulating film to expose a conductive path of a lower layer side at a bottom portion thereof, by supplying one of a gas of boron compound and a gas of organic compound containing aluminum to the insulating film;
    forming an adherence film made of a ruthenium (Ru) film directly on the surface of the insulating film onto which the boron atoms or the aluminum atoms are adsorbed; and
    filling copper serving as a conductive path in the recess.

2. The method of claim 1, wherein said adsorbing is adsorbing the boron atoms.

3. The method of claim 2, wherein the boron compound is one selected from monoborane ($BH_3$), diborane ($B_2H_6$), trimethylborane ($B(CH_3)_3$), triethylborane ($B(C_2H_5)_3$), dicarbadodecaborane ($C_2B_{10}H_{12}$) and decaborane ($B_{10}H_{14}$).

4. The method of claim 2, further comprising, before adsorbing the boron atoms onto the surface of the insulating film,
    removing, from the insulating film, a hydrophilic surface portion that is formed as carbon is eliminated during formation of the recess using plasma etching.

5. The method of claim 1, wherein said adsorbing is adsorbing the aluminum atoms.

6. The method of claim 5, wherein the organic compound containing aluminum is trimethyl aluminum.

7. The method of claim 5, further comprising, before adsorbing the aluminum atoms, removing, from the insulating film, a hydrophilic surface portion that is formed as carbon is eliminated during formation of the recess using plasma etching.

* * * * *